United States Patent
Holderbach et al.

(10) Patent No.: US 11,483,921 B2
(45) Date of Patent: Oct. 25, 2022

(54) HOLDER FOR THERMALLY CONTACTING AN ELECTRONIC COMPONENT MOUNTED ON A CIRCUIT BOARD AND A COOLING BODY

(71) Applicant: ebm-papst Mulfingen GmbH & Co. KG, Mulfingen (DE)

(72) Inventors: Christoph Holderbach, Buchen (DE); Alexander Lust, Obersulm (DE); Nico Hirschlein, Bad Mergentheim-Rengershausen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 0 days.

(21) Appl. No.: 16/997,520

(22) Filed: Aug. 19, 2020

(65) Prior Publication Data

US 2021/0059041 A1 Feb. 25, 2021

(30) Foreign Application Priority Data

Aug. 22, 2019 (DE) ..................... 10 2019 122 640.6

(51) Int. Cl.
*H05K 1/02* (2006.01)
*H05K 7/20* (2006.01)

(52) U.S. Cl.
CPC ......... *H05K 1/0209* (2013.01); *H05K 7/2049* (2013.01); *H05K 7/20445* (2013.01)

(58) Field of Classification Search
CPC ..... H05K 1/0201–0212; H05K 5/0204; H05K 5/0008; H05K 7/2039–20418; H05K 7/205; H05K 7/20445; H05K 7/2049; H05K 2201/066
See application file for complete search history.

(56) References Cited

U.S. PATENT DOCUMENTS

| | | | | |
|---|---|---|---|---|
| 5,309,979 A | * | 5/1994 | Brauer | H01L 23/4093 165/80.2 |
| 6,547,001 B2 | * | 4/2003 | McCullough | B21D 53/02 165/185 |
| 9,147,634 B2 | * | 9/2015 | Kodama | H01L 23/473 |
| 9,560,791 B2 | * | 1/2017 | Aramaki | B32B 27/283 |
| 9,756,740 B2 | * | 9/2017 | Loong | H05K 7/2039 |
| 2004/0174679 A1 | * | 9/2004 | Hung | H01L 23/4006 361/704 |

(Continued)

OTHER PUBLICATIONS

European Search Report dated Feb. 26, 2021 in corresponding European Application No. 20190649.2.

(Continued)

*Primary Examiner* — Jayprakash N Gandhi
*Assistant Examiner* — Amir A Jalali
(74) *Attorney, Agent, or Firm* — Harness, Dickey & Pierce, P.L.C.

(57) ABSTRACT

A holder has a holding body, a spring member, and a tensioning member. The holding body forms a cavity to receive the electronic component. A connecting section has a thermally conductive heat conductive section adjacent to the cavity. The tensioning member tensions the spring member. The spring member supports itself in a tensioned state on a counter-holding member. The spring member moves a connecting surface of the holding body to the cooling body and/or presses it against the cooling body.

18 Claims, 3 Drawing Sheets

(56) References Cited

U.S. PATENT DOCUMENTS

| | | | | |
|---|---|---|---|---|
| 2009/0039504 | A1* | 2/2009 | Kimura | H05K 7/2049 |
| | | | | 257/718 |
| 2010/0226096 | A1* | 9/2010 | Best | H05K 7/2049 |
| | | | | 361/707 |
| 2010/0296255 | A1* | 11/2010 | Maloney | H01L 23/4093 |
| | | | | 361/720 |
| 2011/0059661 | A1* | 3/2011 | Inomata | H05K 3/325 |
| | | | | 439/841 |
| 2012/0218712 | A1* | 8/2012 | Hayashi | H05K 7/2049 |
| | | | | 361/704 |
| 2012/0218718 | A1* | 8/2012 | Wertz | H01L 23/4338 |
| | | | | 361/718 |
| 2018/0035530 | A1* | 2/2018 | Moribayashi | H05K 7/20445 |
| 2018/0343775 | A1* | 11/2018 | Huang | H05K 7/209 |
| 2019/0069438 | A1* | 2/2019 | Guo | H05K 1/0203 |
| 2020/0120830 | A1* | 4/2020 | Song | H05K 7/2039 |
| 2021/0006133 | A1* | 1/2021 | Skinner | H02K 9/22 |

OTHER PUBLICATIONS

German Search Report (in German) dated Apr. 24, 2020 in corresponding German Application No. 10 2019 122 640.6 (9 pages).

\* cited by examiner

HOLDER FOR THERMALLY CONTACTING AN ELECTRONIC COMPONENT MOUNTED ON A CIRCUIT BOARD AND A COOLING BODY

CROSS-REFERENCE TO RELATED APPLICATION

This application claims priority to German Patent Application No. 102019122640.6 filed Aug. 22, 2019. The entire disclosure of the above application is incorporated herein by reference.

FIELD

The disclosure relates to a holder for thermally contacting an electronic component mounted on a circuit board and a cooling body.

BACKGROUND

Electronic components, particularly power electronic components, that are mounted on a circuit board. They generate heat, when in operation, and typically require the heat to be dissipated from the components. To this end, they are mostly connected to a cooling body.

If the cooling bodies are large or heavy or formed integrally with the housing that accommodates the circuit board and the electronic component, the electronic components are frequently thermally connected to the cooling body when they are installed in the housing accommodating the circuit board.

In the prior art, multiple separate components are often necessary to connect the electronic components. Such systems include, for example, a thermal pad, which must be disposed between the component and the cooling body. A clamping member is included that presses the component against the thermal pad after its installation and against the cooling body.

The known solutions, however, often have multiple disadvantages. First, the thermal pad and the clamping member must be pre-mounted in two subsequent steps in the housing or on the cooling body, respectively. Then the circuit board, that can also be called a circuit card, is inserted into the housing and the clamping member installation is finished. Thus, the clamping member presses the electronic component against the thermal pad and the cooling body.

The problem here is that installation of the thermal pad may be forgotten due to the two separate installation steps. Since the installation space of the thermal pad is afterwards often covered by the circuit board, such an error can easily be overlooked. While optical monitoring for detecting this error is possible, it is complex and costly.

In addition to not being able to check if the thermal pad is completely missing, it also cannot be checked if the entire surface of the component rests against the thermal pad. Further, it is not possible to check if, due to incorrect installation, air inclusions or warping or displacement of the thermal pad have occurred. This prevents the intended contact surface of the component from fully contacting the thermal pad. Warping or displacement can occur during the installation of the component on the thermal pad. Thus, such errors can hardly or not at all be detected by optical monitoring.

The thermal pads are typically standard components. The corresponding surfaces of the electronic components and the cooling body that face each other are not necessarily parallel to each other. Thus, an offset or angle between surfaces, in most cases, cannot be remedied by prior art solutions.

Without the thermal pad or if the electronic component does not rest with its entire surface against the thermal pad, heat dissipation from the electronic component to the cooling body is often insufficient. This can damage the component during operation.

Optical monitoring to avoid such errors is either not possible at all or is very elaborate and costly. This is due to the circuit board often covers the cooling body and the thermal pad.

In addition, the installation sequence can have a negative effect on the heat dissipation process. The clamping element in prior art solutions is mostly added after the circuit board has been installed in the housing. Thus, the power module or the electronic component is already fixed to the circuit board on its pin side. The deflection width of the component or a deflection angle by which the component must be deflected or tilted towards the thermal pad includes all tolerances that can occur during the installation of the circuit board.

The deflection angle of the electronic component is positioned in opposing directions due to the installation process. Thus, the often manufacturing related draft angle of the housing or the cooling body, which makes a parallel contact of the surfaces of the electronic component and the electronics housing or the cooling body are impossible. Thus, once again an air gap or air inclusions between the electronic component and the cooling body may occur.

Therefore, the underlying problem of the disclosure is to overcome the disadvantages mentioned above. The disclosure provides a holder for thermally contacting an electronic component mounted on a circuit board and a cooling body. Thus, the holder thermal contacting can be produced in a cost-effective and at the same time reliable manner.

SUMMARY

This problem is solved by the combination of features according to a holder for thermally contacting an electronic component mounted on a circuit board with a cooling body. The holder includes a holding body, a spring member, and a tensioning member. The holding body forms a cavity corresponding to the electronic component to receive the electronic component. It includes a connecting section and a thermally conductive heat conductive section adjacent to the cavity. A thermal connecting surface faces away from the cavity. The tensioning member is configured to tension the spring member. The spring member is configured to support itself in a tensioned state on a counter-holding member. It applies force onto the holding body and/or onto the component receivable in the cavity of the holding body. The spring member moves the connecting surface of the holding body to the cooling body and/or presses it against the cooling body.

According to the disclosure, a holder is proposed for thermally contacting an electronic component mounted on a circuit board and a cooling body. The holder comprises a holder body, a spring member, and a tensioning member. The holding body forms a cavity corresponding to the electronic component to receive the electronic component. It has a connecting section and a thermally conductive heat conducting section adjacent to the cavity. The heat conducting section has a thermal connecting surface facing away from the cavity. The surface is preferably configured to rest entirely against the cooling body after installation is finished. Thus, the heat conducting section has full surface-to-surface contact with the electronic component on its side facing the cavity and with the cooling body on its thermal connecting surface and thermally connects the two. The tensioning member is configured to tension the spring member. The spring member is configured, in a tensioned state, to be supported on a counter-holding member. The spring member applies a force onto the holding body and/or the component that can be received in the cavity of the holding body. Preferably, this displaces the holding body with its connecting surface substantially orthogonally to the connecting surface towards the cooling body and/or to press the same against the cooling body.

Depending on the respective embodiment, the holder can include the counter-holding member. It is preferred that the counter-holding member is substantially stationary with respect to the circuit board and/or the cooling body. Alternatively, the counter-holding member can be formed integrally with the cooling body or, for example, with the circuit board.

The electronic component preferably is configured as a single inline package (SIP), that is, with a single-row housing having a single row of contact pins. The pins can contact on the circuit board. Particularly, such components can be power modules for transforming electric energy. They heat up in operation. Thus, the heat must be dissipated to prevent damage to the component itself and to surrounding electronic components. An electronic component meant for being received in the holder can in addition be another component, with a housing, and require cooling or be connected to a cooling body, when in operation. For example, housings of the TO-220 type can be accommodated by the holder. The holder or cavity of the holding body must be formed so that it corresponds to the respective electronic component.

If a heat dissipating surface is provided on the electronic component, the holding body is preferably configured such that the component can be received in the cavity. Its heat dissipating surface faces the heat conductive section and rest against the same.

It is preferred that the proposed holder for thermally contacting an electronic component of a motor controller has a cooling body. The motor controller is disposed in a housing or housing lid of an electric motor. The housing or the housing lid has cooling fins and is formed integrally with the cooling body. Furthermore, the electric motor preferably drives a ventilator or fan or is integrally formed as such.

In an advantageous variant of the disclosure, the connecting section is dimensionally stable at the prevailing temperatures of the holder when it is used as intended. It may, for example, be formed of a thermoplastic material. The heat conductive section is formed of a heat conductive thermoplastic material. Thus the connecting section can be called the hard component and the heat conductive section can be called the soft component of the holding body. The soft component can deform due to the exposure to heat from the electronic component. It can adjust both to the electronic component and to the adjacent region of the cooling body. Thus, it can be in form-fitting contact by plastic deformation, displacing any air inclusions.

The holder is preferably formed in one piece. The connecting section is integrally connected to the heat conductive section. To this end, the holding body can be produced, for example, in a multi-component injection molding process. In this case in a two-component injection molding process. The hard component can be formed as described of a thermoplastic material and the soft component can be formed of a thermoplastic elastomer.

Furthermore, in a likewise advantageous embodiment of the holder according to the disclosure, a wall surrounding the cavity is formed by the connecting section and the heat conductive section.

In an advantageous development, the wall is divided into multiple wall sections. Preferably, one wall section is associated with one side of the electronic component. One wall section is formed by the connecting section or by the connecting section and the heat conductive section. Furthermore, the wall sections are, preferably at least partially, in contact with the electronic component. Thus, the component is fixedly held in the cavity by respective opposing wall sections.

In addition, the connecting section encloses the heat conductive section like a frame in an advantageous variant.

For placing the electronic component in the holder or holding body, respectively, the holding body includes an opening connected to the cavity. The electronic component can be inserted in the cavity through the opening. The opening faces the circuit board where the electronic component is mounted.

In an advantageous variant, the holding body has five wall sections. Each wall section is adjacent to the cavity or an electronic component that can be received therein. An opening replaces a sixth wall section. Thus, the cavity of the holding body is defined by the five wall sections and the opening. In addition, the heat conductive section can extend over one or more wall sections. The heat conductive section is framed by the connecting section.

A wall section facing the cooling body can furthermore be wedge-shaped. Thus, an angular offset can be compensated between a substantially vertically extending surface of the electronic component facing the heat conductive section and a surface of the cooling body extending obliquely thereto and facing the connecting surface. The surface of the cooling body facing the connecting surface, pressing against the connecting surface, is particularly formed obliquely in cooling bodies produced by a casting method. This is due to the requirement of the necessary draft angle for removing the body from the casting mold.

Moreover, in one embodiment, spacers can be provided in the section of the wall facing the cooling body or adjacent to it in the final installed state. The spacers are, for example, formed integrally with the connecting section. They extend web-like therefrom or from the hard component into the heat conductive section or the soft component. They predetermine the minimum distance between the electronic component and the cooling body. If the electronic component is brought into direct contact with the spacers and the spacers are brought into direct contact with the cooling body, they cannot come closer to each other. Thus, a predetermined minimum distance cannot be overcome, regardless of potential plastic deformation of the heat conductive section.

To simplify pre-assembly, it is preferred that the tensioning member and the spring member are received at the connecting section.

An embodiment is particularly advantageous where the connecting section forms first and second latching members. The first latching members hold the tensioning member. The second latching members hold the spring member on the connecting section. The tensioning member and the spring member can be movably received. The area where they can move is limited by the first and second latching members.

It is therefore not necessary during installation to grab multiple elements separately and fasten them to the circuit board or other elements. Instead, the holder can be provided, stored, picked up, and installed in its entirety with all its connected components. Although the spring member and the tensioning member can move relative to the holder body within the limits allowed by the latching members, they are still captively connected. Thus, the holder includes multiple components, but is formed in one piece.

To prevent the holder from being displaced or moving out of the cavity of the holding body, the holding body, in another advantageous embodiment, forms third latching members that project into the cavity. The third latching members are configured to secure the component receivable in the cavity in that cavity. The electronic component may include latching recesses for this purpose. Alternatively, the third latching members can, for example, engage around an edge of the electronic component that faces the circuit board.

If the electronic component is initially secured to the circuit board by the holder and only thereafter electrically connected to the circuit board, one variant advantageously provides that the holding body has fourth latching members. The fourth latching members extend to the circuit board where the electronic component is or can be mounted. The holder can be secured to the circuit board using the fourth latching members. To this end, the circuit board may have latching openings that the fourth latching members can engage. The latching openings may also be oblong. Thus, the holder and the electronic component received therein can move towards the cooling body by tensioning the spring member.

In an advantageous embodiment, the spring member is a leaf spring that has a first edge and a second edge. The second edge is spaced apart from the first edge in the longitudinal direction of the leaf spring. The spacing increases when the spring member is tensioned by the tensioning member. This is achieved by reducing the height of the leaf spring by tensioning against the spring force. Thus, the ends or edges of the leaf spring are spread apart. The first edge is configured to support itself on the counter-holding member in the tensioned state. The second edge is configured to rest against the holding body and/or the component receivable in the cavity of the holding body in the tensioned state.

In an advantageous variant, the tensioning member is a screw. The counter-holding member has a thread into which the screw can be screwed. The leaf spring is preferably clamped between the screw head or a washer adjacent to the screw head and the counter-holding member. The screw extends through the leaf spring via an opening in the leaf spring. Thus, screwing the screw into the counter-holding member reduces the spacing between the screw head and the counter-holding member. The leaf spring is compressed and its edges are spread apart, respectively. Alternatively, a body with a thread can be part of the tensioning member. For example, the tensioning member can be configured as a screw and a nut or a screw and a plate having a thread. Thus, the screw head and the nut or plate move towards each other by screwing and compress or tension the spring member. Thus, the spring member spreads apart and moves the holding body in this manner.

Another aspect of the disclosure relates to a circuit board with an electronic component and a holder according to the disclosure.

In an advantageous variant, the circuit board has an opening through which the tensioning member can be operated and the spring member can be tensioned by the tensioning member. If the tensioning member is a screw, it can, for example, be screwed into the counter-holding member using a screwdriver inserted through the opening of the circuit board.

Moreover, in an advantageous embodiment of the circuit board, the holder is fastened to the circuit board with the fourth latching members. The position of the electronic component received in the cavity of the holder for mounting the electronic component to the circuit board is predetermined. The component can, for example, be mounted by soldering the contact pins of the electronic component with the contact areas provided on the circuit board.

Another aspect of the disclosure relates to an electronics module or module having a housing, a cooling body, a circuit board according to the disclosure, or a circuit board and a holder according to the disclosure.

Particularly advantageous is an embodiment of the module where the counter-holding member is formed integrally by the housing. The holder can be fastened to the housing by the counter-holding member. To this end, the housing or the counter-holding member may have a thread that receives a tensioning member configured as a screw. Alternatively, the tensioning member can be provided as a latching pin. The counter-holding member or the housing has a corresponding latching opening that receives the latching pin. Thus, he spring member is compressed by the latching pin inserted in the latching opening and the holding body is moved or pressed against the cooling body.

Moreover, in a particularly advantageous variant of the module, the housing integrally forms the cooling body.

The disclosure also proposes installation methods associated with the holder.

In a first advantageously installation method, the electronic component is first mounted on the circuit board and then electrically connected thereto. Then, or prior to that, the holder is placed on the electronic component. Thus, the electronic component is received in the cavity of the holding body. The circuit board with the electronic component and the mounted holder is disposed in a housing or on a cooling body, but not secured. By tensioning the spring member, the holding body and the loosely inserted circuit board are moved against the cooling body or pressed against a surface of the cooling body situated opposite the connecting surface of the holding body. Only after the final position is determined by tensioning the spring member and the electronic component is thermally contacted to the cooling body, is the circuit board secured to the housing or the cooling body, for example, by a screwed connection.

In an alternative second, likewise advantageous, installation method the electronic component is inserted into the holder and secured to the circuit board by the fourth latching members of the holder. Thus, the electronic component is held by the holder in a specified position on the circuit board. Subsequently, the electronic component can, for example, be electrically bonded with the circuit board or the connecting points provided for this purpose on the circuit board. For this variant of the installation method, the holder and the electronic component can be provided as an assembly.

Other advantageous further developed embodiments of the disclosure are characterized in the dependent claims and/or are described in more detail through the drawings in conjunction with the description of the preferred embodiment of the disclosure.

DRAWINGS

The drawings described herein are for illustrative purposes only of selected embodiments and not all possible implementations, and are not intended to limit the scope of the present disclosure.

DETAILED DESCRIPTION

Figure 1:
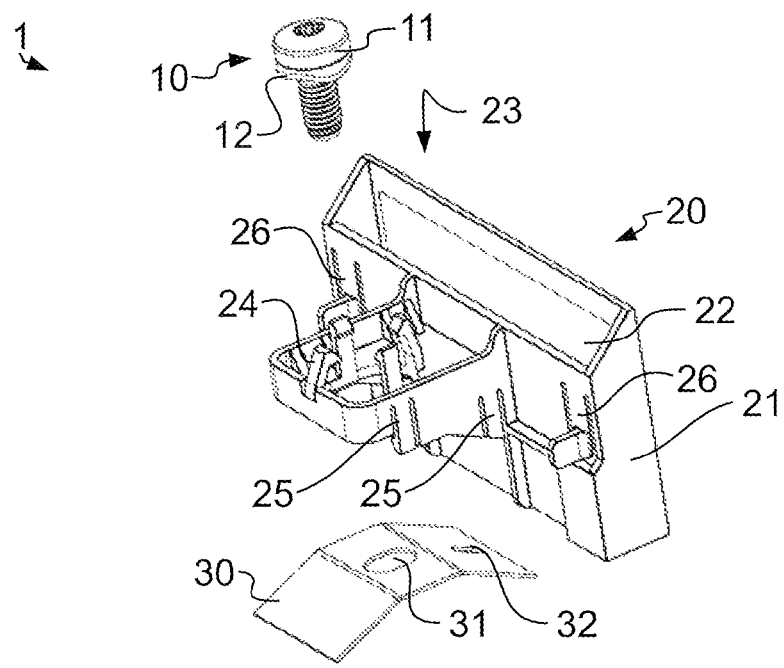
FIG. 1 is an exploded perspective view of the components of the holder separate from each other.
Figure 3:
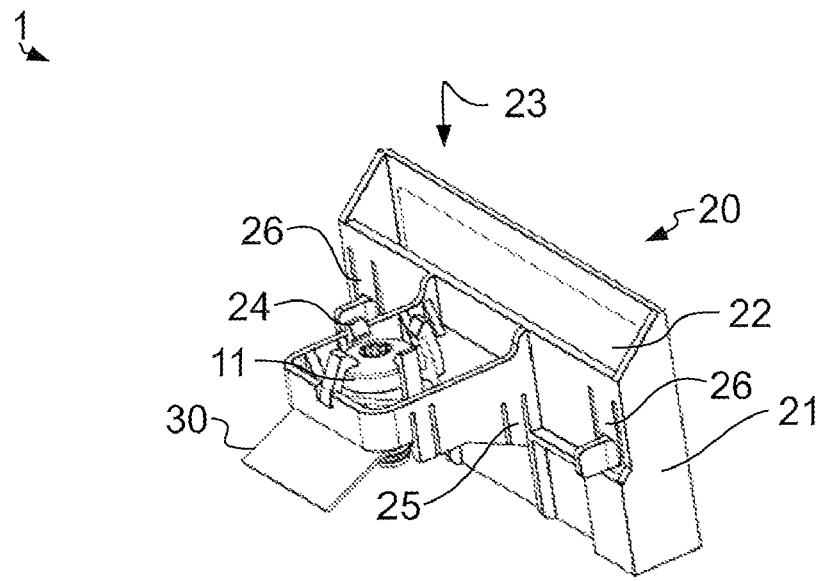
FIG. 3 is a perspective view of the holder obliquely from above.
Figure 4:
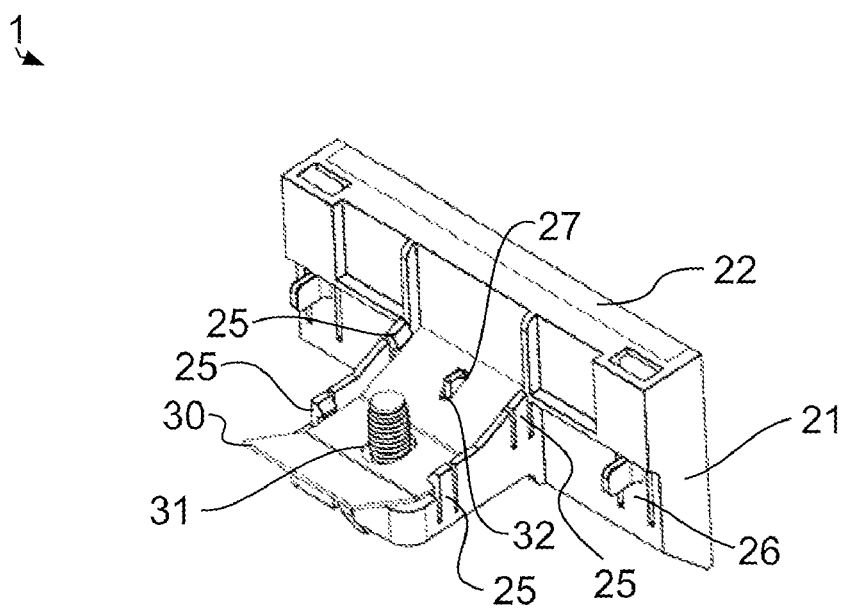
FIG. 4 is a perspective view of the holder obliquely from below.
Figure 5:
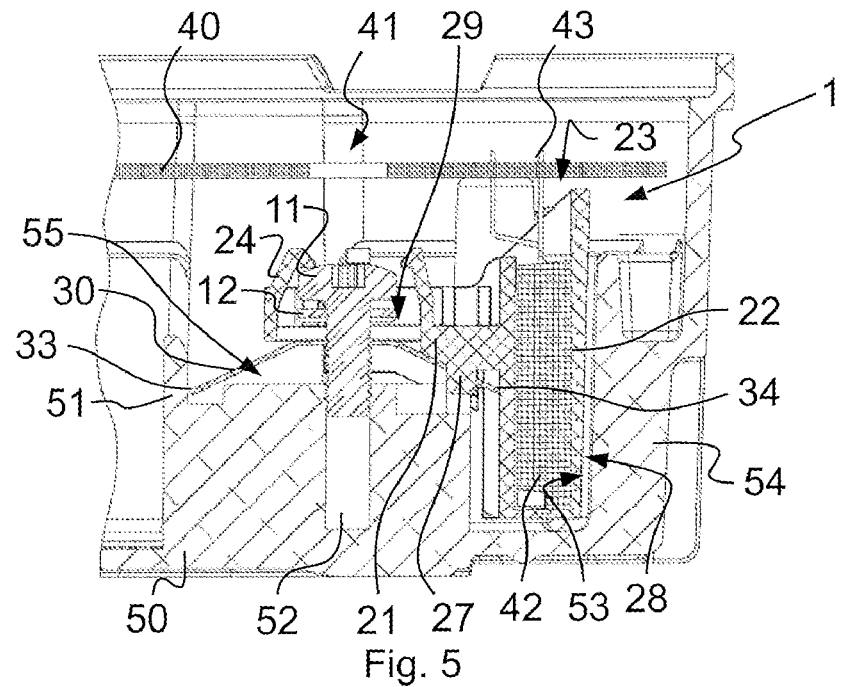
FIG. 5 is a cross-sectional view of the holder in a pre-assembled state.
Figure 6:
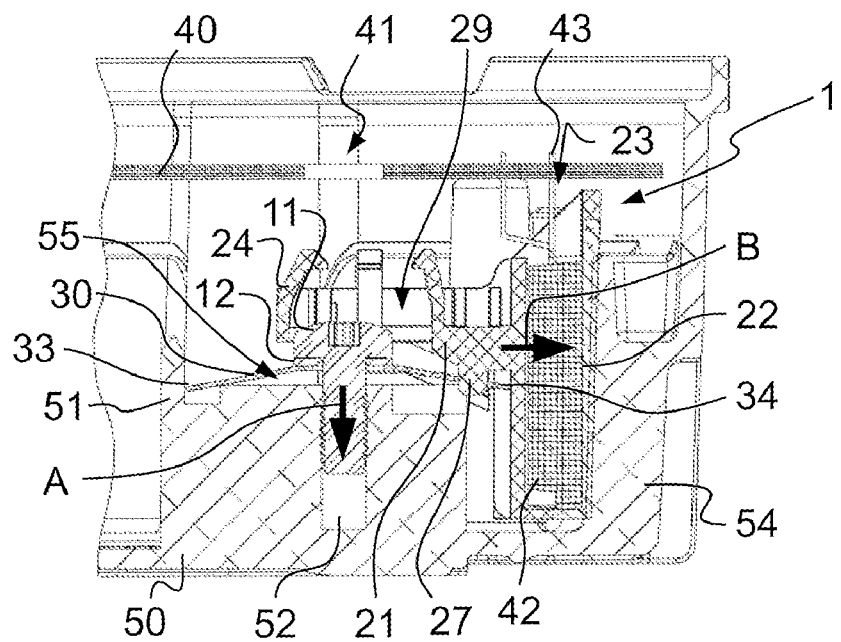
FIG. 6 is a cross-section sectional view of the holder in a final installed state.

FIG. 1 shows the holder 1 having three components. The three components are the holding body 20, the tensioning member 10, and the spring member 30, separate from each other. The holding body 20 alone is also shown rotated in FIG. 2. The holder 1 with its captively connected components is shown in FIGS. 3 and 4. FIGS. 5 and 6 show various installation states of the holder 1 shown in FIGS. 1 to 4. Thus, the following description substantially applies to all figures.

The holding body 20 forms four first latching members 24 on its connecting section 21. They are configured to receive the screw head 11 of the tensioning member 10 that is configured as a screw. They captively accommodate the tensioning member 10 on the holding body 20. The holding body 20 further forms four second latching members 25 on its connecting section 21. They are configured to engage around the opposing side edges of the spring member 30. The spring member 30 is configured as a leaf spring. The second latching members 25 connect the spring member 30, likewise captively, to the holding body 20.

The cavity of the holding body 20 is defined by both the connecting section 21 and the heat conductive section 22 of the holding body 20. The cavity is open due to an opening 23. The electronic component 42 can be introduced or inserted into the cavity through opening 23. For thermal contacting the component 42 to a cooling body 54, as shown, for example, in FIGS. 5 and 6, the heat conductive section 22 is formed of a thermally conductive material. Towards the cavity, it rests against the received or receivable component 42 or against a heat dissipating surface of the electronic component 42. The heat conductive section 22 forms a connecting surface 28 facing away from the cavity, with which section it rests or can rest against the cooling body 54 in the final installed state.

Figure 2:
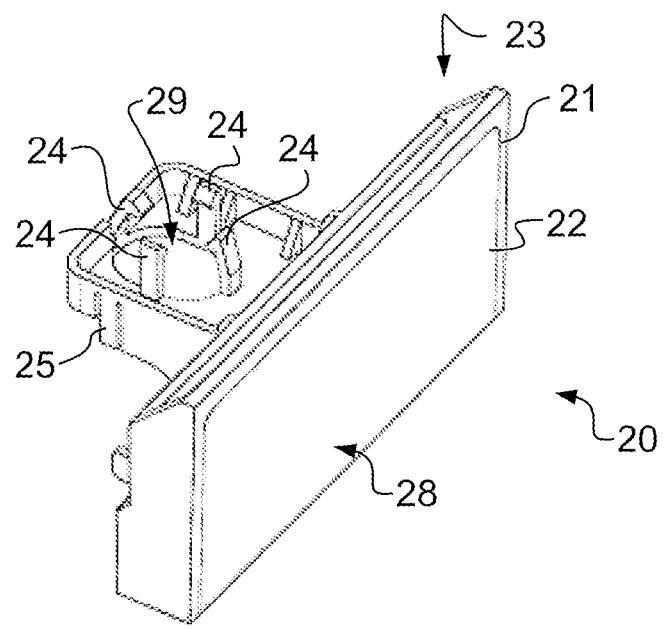
FIG. 2 is a perspective view of the holding body of the holder.

As particularly visible in FIGS. 2 and 4, the heat conductive section 22 is surrounded or enclosed. in a frame-like manner, by the connecting section 21. The heat conductive section 22 extends across two wall sections. The connecting section 21 is preferably formed of a thermoplastic material. It remains solid at the prevailing temperatures during the intended use. Thus, the connecting section 21 can be called a hard component. It holds the other components of the holder 1 as well as the heat conductive section 22. The heat conductive section 22 is further formed of a thermoplastic elastomer. It can be plastically deformed when exposed to temperature. Thus, the heat conductive section 22 fits snugly to the cooling body 54 as well as to the electronic component 42 at the prevailing temperatures during the intended use.

To secure the electronic component 42, two third latching members 26 are provided. They are spaced from each other. A latching nose extends into the cavity. The noses are configured to latch with a latching recess provided in the electronic component 42. The projections of the latching members 26 extend away from the cavity. Each are operating members that can be operated by a tool or manually to unlatch the latching noses of the latching members 26 from the component 42. This enables removal of the component 42 more easily from the cavity.

FIG. 4, particularly, shows the holder 1 from a bottom view with respect to the representation of the holder 1 in FIGS. 1 to 3. FIG. 4 makes the connection of the spring member 30 and the holding body 20 visible. The spring member 30 is held by a total of four second latching members 25. They are opposed in pairs. A recess 32 is provided in the spring member 30. A guiding web 27, formed by the connecting section 21 of the holding body 20, extends through the recess 32. The spring member 30 is guided by the guiding web 27 through the tensioning member 10 if compressed or tensioned. Thus, the spring member 30 cannot inadmissibly evade, which prevents that no force or an insufficient force is applied to the holding body 20. In this case, the tensioning member 10 is configured as a screw. A section passes through an opening 31 provided in the spring member 30.

The sectional view of FIG. 5 shows a part of the housing 50, that integrally forms both the counter-holding member 51 and the cooling body 54. A circuit board 40 is disposed in the housing 50. Disposing the circuit board 40 in the housing hides the connecting region to the cooling body 54 of the electronic component 42 provided on the circuit board 40. In order to thermally connect the component 42 to the cooling body 54 in a reliable manner, the component 42 is plugged onto a holder 1. The circuit board 40 is inserted into the housing with its electronic component 42 an the holder 1 plugged onto the same. Then the circuit board 40 can be secured to the housing 50 at the connecting points not shown herein. The tensioning member 10, which is configured as a screw, is inserted through the opening 41 in the circuit board 40 and rotated. Thus, it is screwed into a thread 52 formed in the counter-holding member 51 by a tool or by a screwdriver which is placed in the receptacle of the screw head 11.

The first state shown in FIG. 5 is initially reached where the tensioning member 10 and thus the entire holder 1 are already connected to the counter-holding member 51 and integrally connected to the housing 50. The spring member 30 is not yet tensioned. The heat conductive section 22 or its connecting surface 28 are not yet contacted to the cooling body 54 or its connecting surface 53.

In the embodiment shown in FIGS. 1 to 6, the tensioning member 10, configured as a screw, is held at the holding body 20. Mobility of the screw head 11 with respect to the representation in FIGS. 5 and 6 is limited at the top by the first latching members 24. It is limited at the bottom by the spring member 30. The mobility is limited at the top by the connecting section 21 and at the bottom by the second latching members 25. An orthogonal or lateral mobility of the tensioning member 10 and the spring member 30 is limited by the respective latching members 24, 25 or the connecting member. The spring member 30 is particularly limited by the guiding web 27. The tensioning member 10 and the spring member 30 can at least partially detach from the holding body 20 or from the latching with the respective latching members 24, 25 during installation. However, the spring member 30 is guided by the guiding web 27. Thus, they still remain in a predetermined position and press the holding body 20 against the cooling body 54.

The sectional view of FIGS. 5 and 6 clearly shows that the wall section adjacent to cooling body 54 has a wedge-like shape tapering downwards. This compensates for an angular offset between the substantially vertical surface of the electronic component 42, facing the cooling body 54, and the connecting surface 53 of the cooling body 54, forming an oblique draft angle.

Starting from the first state shown in FIG. 5. the tensioning member 10 is further screwed into the counter-holding member 51 or its thread 52. A tool extends through the opening 41 of the circuit board 40 in the direction A. The screw head 11 and the washer 12, provided at the screw, distributes the force to the spring member 30. They are moved through the opening 29 formed in the connecting section 21 and press against the spring member 30. If the screw is screwed further in the direction A into the thread 52, the screw head 11 or the washer 12, respectively, approximates the surface 55 of the counter-holding member 51 or the housing 50. Thus, the spring member 30 is compressed between the washer 12 and the surface 55. The first edge 33 and the second edge 34 of the spring member 30 are spread apart. The first edge 33 comes to rest against the counter-holding member 51 and supports itself on it. The second edge 34 comes to rest against the holding body 20 and in the exemplary embodiment shown, against a wall section adjacent to the cavity or the electronic component 42. Thus, the holding body 20 is moved in the direction B due to the spreading apart of the first and second edges 33, 34 relative to the counter-holding member 51 or the housing 50, respectively. By moving the holding body 20 in the direction B, the connecting surface 28 of the heat conductive section 22 approximates the connecting surface 53 of the cooling body 54. It ultimately comes to rest against it. Thus, the connecting surfaces 28, 53 are pressed against each other. This corresponds to the second, final installed state of the holder 1 shown in FIG. 6.

The spring member 30 continues to apply a force or a spring force to the holding body 20. The holding body 20 is pressed further towards the cooling body 54 if plastic deformation of the heat conductive section 22 occurs.

In the exemplary embodiment shown, the contact pins 43 of the electronic component 42 are moved together with the electronic component and the holder 1 in the direction B. To enable such movement of the contact pins 43 in the circuit board 40, oblong recesses may be provided for the through-hole mounting of the component 42. Thus, a movement can only be possible within the limits of the clearance of the recesses relative to the contact pins 43. The contact pins 43 are only soldered or electrically contacted after the component 42 has been thermally connected to the cooling body 54.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A holder for thermally contacting an electronic component mounted on a circuit board with a cooling body comprising:
   the holder includes a holding body, a spring member, and a tensioning member;
   the holding body forms a cavity corresponding to the electronic component to receive the electronic component and comprises a connecting section including a receiving portion configured to receive the tensioning member, a thermally conductive heat conductive section, adjacent to the cavity, and a thermal connecting surface, facing away from the cavity;
   the tensioning member is associated with the receiving portion of the connecting section and is configured to tension the spring member; and
   the spring member configured to support itself in a tensioned state on a counter-holding member to apply a force directly onto the holding body and onto the component receivable in the cavity of the holding body, the spring member moves the connecting surface of the holding body to the cooling body and presses it against the cooling body.

2. The holder according to claim 1, wherein
   the connecting section is dimensionally stable and the heat conductive section is formed of a thermoplastic elastomer.

3. The holder according to claim 1, wherein the holding body is formed in one piece.

4. The holder according to claim 1, wherein a wall surrounding the cavity is formed by the connecting section and the heat conductive section.

5. The holder according to claim 1, wherein the connecting section encloses the heat conductive section in a frame-like manner.

6. The holder according to claim 1, wherein the tensioning member and the spring member are received at the connecting section.

7. The holder according to claim 6, wherein
   the connecting section includes first latching members and second latching members,
   the first latching members hold the tensioning member and the second latching members hold the spring member on the connecting section.

8. The holder according to claim 7, wherein the holding body includes third latching members that project into the cavity and are configured to secure the electronic component, that can be received in the cavity, in the cavity.

9. The holder according to claim 8, wherein the holding body includes fourth latching members that extend to the circuit board where the electronic component is mounted, and the holder can be secured to the circuit board using the fourth latching members.

10. The holder according to claim 1, wherein
    the holding body has an opening connected to the cavity and the electronic component can be inserted into the cavity through the opening; and
    the opening faces the circuit board where the electronic component is mounted.

11. The holder according to claim 1, wherein
    the spring member is a leaf spring with a first edge and a second edge spaced apart from the first edge in the longitudinal direction of the leaf spring, a spacing increases when the spring member is tensioned by the tensioning member; and
    the first edge is configured to support itself on the counter-holding member in the tensioned state, and the second edge is configured to rest against the holding body and the component receivable in the cavity of the holding body in the tensioned state.

12. The holder according to claim 1, wherein the tensioning member is a screw and the counter-holding member has a thread to receive the screw.

13. A circuit board with an electronic component and a holder comprising:
   the holder includes a holding body, a spring member, and a tensioning member;
   the holding body forms a cavity corresponding to the electronic component to receive the electronic component and comprises a connecting section including a receiving portion configured to receive the tensioning member, a thermally conductive heat conductive section, adjacent to the cavity, and a thermal connecting surface, facing away from the cavity;
   the tensioning member is associated with the receiving portion of the connecting section and is configured to tension the spring member; and
   the spring member configured to support itself in a tensioned state on a counter-holding member to apply a force directly onto the holding body and onto the component receivable in the cavity of the holding body, the spring member moves the connecting surface of the holding body to the cooling body and presses it against the cooling body.

14. The circuit board according to claim 13, wherein the circuit board has an opening through which the tensioning member can be operated and the spring member can be tensioned by the tensioning member.

15. The circuit board according to claim 13, wherein
   the holder is fastened to the circuit board with the latching members, and the position of the electronic component received in the cavity of the holder for mounting the electronic component to the circuit board is predetermined.

16. A module includes a housing, a cooling body, a circuit board according to claim 13.

17. The module according to claim 16,
   wherein the counter-holding member is integrally formed by the housing and the holder can be secured to the housing by the counter-holding member.

18. The module according to claim 16,
   wherein the housing integrally forms the cooling body.

* * * * *